(12) United States Patent
Dillig et al.

(10) Patent No.: US 9,007,790 B2
(45) Date of Patent: Apr. 14, 2015

(54) FREQUENCY CONVERTER AND METHOD FOR IDENTIFYING AND BLOCKING A FAULT CURRENT IN A FREQUENCY CONVERTER

(75) Inventors: Reinhold Dillig, Memmelsdorf (DE); Bernd Herrmann, Herzogenaurach (DE); Hubert Schierling, Erlangen (DE); Benno Weis, Hemhofen (DE)

(73) Assignee: Siemens Aktiengesellschaft, München (DE)

( * ) Notice: Subject to any disclaimer, the term of this patent is extended or adjusted under 35 U.S.C. 154(b) by 207 days.

(21) Appl. No.: 13/605,636

(22) Filed: Sep. 6, 2012

(65) Prior Publication Data

US 2013/0235618 A1  Sep. 12, 2013

(30) Foreign Application Priority Data

Sep. 7, 2011  (EP) .................................... 11180307

(51) Int. Cl.
*H02M 1/32* (2007.01)
*H02H 7/12* (2006.01)
*G01R 31/42* (2006.01)

(52) U.S. Cl.
CPC ............... *H02H 7/1216* (2013.01); *H02M 1/32* (2013.01); *G01R 31/42* (2013.01)

(58) Field of Classification Search
CPC .............................. H02H 7/1216; H02M 1/32
USPC ......................................... 361/44; 363/50–51
See application file for complete search history.

(56) References Cited

U.S. PATENT DOCUMENTS

| | | | |
|---|---|---|---|
| 4,870,527 | A | 9/1989 | Zaleski |
| 6,760,239 | B2 | 7/2004 | Schierling |
| 6,762,705 | B2 | 7/2004 | Bruckmann et al. |
| 6,850,424 | B2 | 2/2005 | Baudelot et al. |
| 6,862,163 | B2 | 3/2005 | Schierling et al. |
| 6,914,397 | B2 | 7/2005 | Schierling |
| 6,943,611 | B2 | 9/2005 | Braun et al. |
| 7,301,736 | B2 | 11/2007 | Schierling |
| 7,327,053 | B2 | 2/2008 | Eckardt et al. |
| 7,394,627 | B2 | 7/2008 | Bruckmann et al. |
| 7,489,124 | B2 | 2/2009 | Schierling |
| 7,529,111 | B2 | 5/2009 | Schierling |
| 7,622,886 | B2 | 11/2009 | Schierling |
| 7,652,585 | B2 | 1/2010 | Schierling |
| 7,825,533 | B2 | 11/2010 | Schierling |
| 2003/0179021 | A1 | 9/2003 | Braun et al. |

(Continued)

FOREIGN PATENT DOCUMENTS

| | | |
|---|---|---|
| EP | 0 490 388 A2 | 6/1992 |
| GB | 2 309 597 A | 7/1997 |
| WO | WO 93 03530 A1 | 2/1993 |

*Primary Examiner* — Harry Behm
(74) *Attorney, Agent, or Firm* — Henry M. Feiereisen LLC

(57) ABSTRACT

In a frequency converter operated for safety of personnel and/or fire protection via a ground fault interrupter is frequently not able to distinguish between an actual fault current and an operationally generated leakage current. The proposed method addresses this problem by determining a course of a magnitude of a current flowing through the frequency converter, predefining a signal portion which is independent of switching processes within the frequency converter while the frequency converter operates fault-free, checking whether the determined course satisfies a criterion that is predetermined depending on the signal portion, and interrupting the current the determined course fails to satisfy the predetermined criterion.

7 Claims, 4 Drawing Sheets

(56) References Cited

U.S. PATENT DOCUMENTS

| | | |
|---|---|---|
| 2005/0067906 A1 | 3/2005 | Schierling et al. |
| 2006/0187085 A1 | 8/2006 | Griepentrog |
| 2007/0053213 A1 | 3/2007 | Brune et al. |
| 2008/0191356 A1 | 8/2008 | Leibold et al. |
| 2008/0310202 A1 | 12/2008 | Schierling |
| 2009/0160453 A1* | 6/2009 | Tiihonen et al. .............. 324/509 |
| 2009/0296289 A1* | 12/2009 | Valdez et al. .................. 361/47 |
| 2009/0322083 A1* | 12/2009 | Wagoner et al. ................ 290/44 |
| 2011/0043082 A1 | 2/2011 | Billmann et al. |
| 2011/0187480 A1 | 8/2011 | Schierling et al. |
| 2011/0270545 A1* | 11/2011 | Doktar et al. .................. 702/58 |
| 2013/0170077 A1* | 7/2013 | Dillig et al. .................... 361/18 |

* cited by examiner

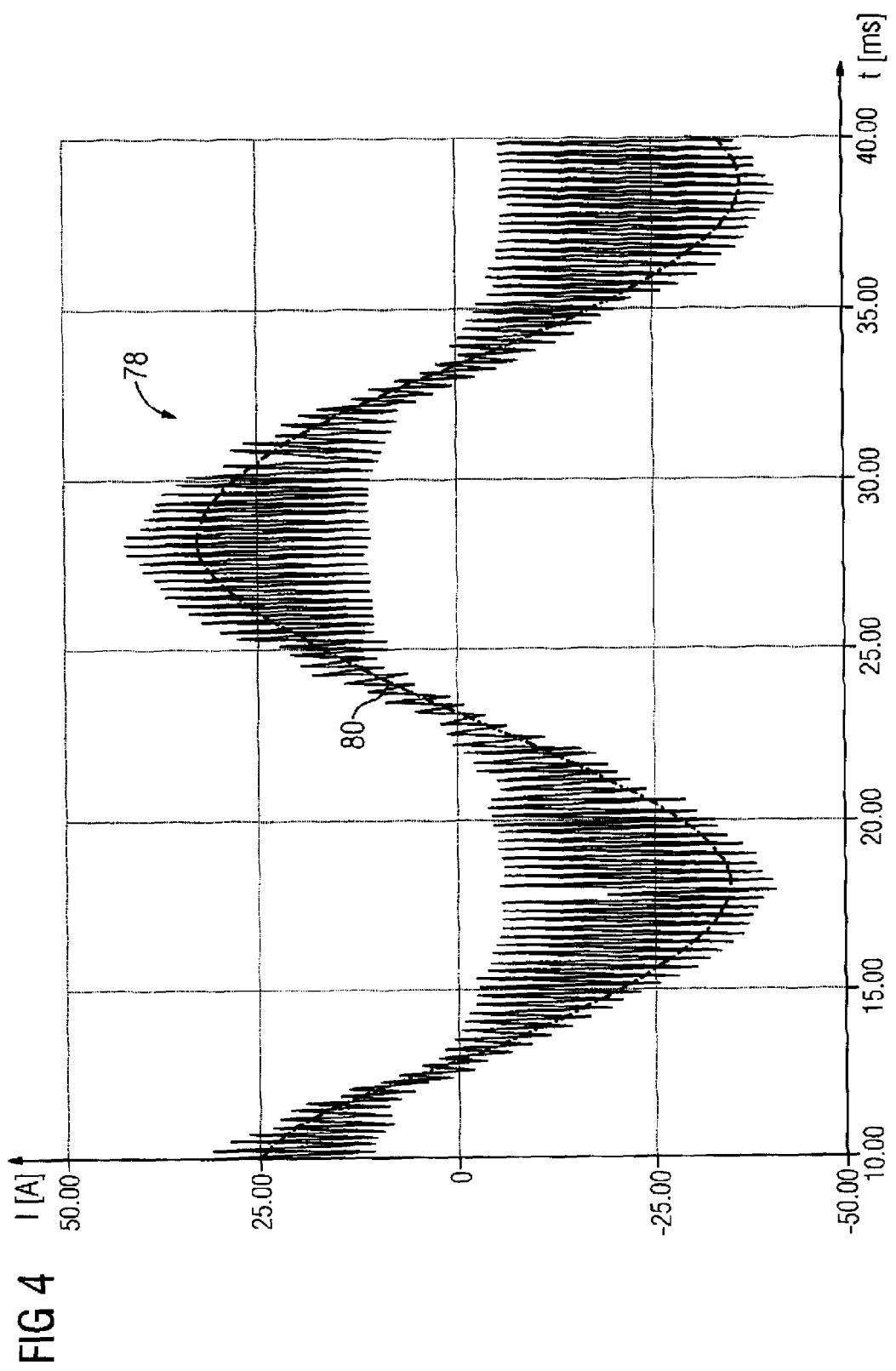

FREQUENCY CONVERTER AND METHOD FOR IDENTIFYING AND BLOCKING A FAULT CURRENT IN A FREQUENCY CONVERTER

CROSS-REFERENCES TO RELATED APPLICATIONS

This application claims the priority of European Patent Application, Serial No. EP 11180307, filed Sep. 7, 2011, pursuant to 35 U.S.C. 119(a)-(d), the content of which is incorporated herein by reference in its entirety as if fully set forth herein.

BACKGROUND OF THE INVENTION

The present invention relates to a method for identifying and if necessary blocking a fault current in a frequency converter. The invention also includes a frequency converter for generating an AC voltage with a predefinable alternating frequency from a mains voltage with a fixed alternating frequency.

The following discussion of related art is provided to assist the reader in understanding the advantages of the invention, and is not to be construed as an admission that this related art is prior art to this invention.

An electrical machine can be operated in an electrical mains power supply for instance with a frequency converter. By means of the frequency converter an alternating current can be generated in stator windings of the machine in such cases, and in this process a frequency of the AC voltages of the individual motor cables can be set. To this end, both the frequency and also the amplitude of the AC voltage is predetermined by the AC converter by means of semiconductor power switches from the dc voltage of the intermediate circuit in each of the phase conductors on the basis of a pulse width modulation for instance. On account of the pulse width modulation used, fault currents may result during normal operation, i.e. currents which are not closed within the network but instead by way of a ground potential or chassis potential. In such cases the leakage currents can flow via a capacitive coupling between the arrangement comprising the frequency converter and the electrical machine on the one hand and objects in its surroundings on the other hand.

If the arrangement is to be able to be operated by way of a ground fault interrupter for personal safety and/or fire protection, the problem may arise in that such an interrupter cannot distinguish between an actual fault current (caused by a damaged cable for instance) and a leakage current generated during operation.

It would therefore be desirable and advantageous to obviate prior art shortcomings and to provide an improved ground fault interrupter in a frequency converter.

SUMMARY OF THE INVENTION

According to one aspect of the present invention, a method for identifying and/or blocking a fault current in a frequency converter includes the steps of determining a course of a magnitude of a current flowing through the frequency converter, predefining for the determined course a signal portion which is independent of switching processes within the frequency converter while the frequency converter operates fault-free, checking whether the determined course satisfies a criterion that is predetermined depending on the signal portion, and interrupting the current the determined course fails to satisfy the predetermined criterion.

According to another aspect of the present invention, a frequency converter for generating an AC voltage with a first predetermined alternating frequency from a mains voltage having a second predetermined alternating frequency, includes a rectifier representing a first component and generating an intermediate DC voltage from the mains voltage, an intermediate circuit representing a second component, an inverter representing a third component and generating the AC voltage from the intermediate DC voltage, and a measuring device for measuring a current magnitude of a common mode current operatively connected to at least one of the first, second and third components.

The signal portion may be, for example, a specific frequency band or specific temporal sections within the course. In order to identify the presence of a fault current, a check is carried out to determine whether, with the determined course, a criterion predetermined as a function of this signal portion is fulfilled. If this is the case, the current conducted via the frequency converter is interrupted. The criterion which is predetermined depends on the point at which the course was determined in the frequency converter and which signal portion is monitored.

According to an advantageous feature of the present invention, a reliable distinction can be made between an operational leakage current and an unwanted fault current. Instead of connecting a ground fault interrupter on the mains side upstream of the rectifier of the frequency converter, as is usual in the prior art, at least the determination of the course of the magnitude of the current is moved to dedicated locations within the converter, at which a reliable distinction between a leakage current on the one hand and a fault current on the other hand is possible.

At least one of the three components has a measuring device for measuring a current magnitude of a common mode current. The measuring device enables the course of a current magnitude of a differential current to be determined between at least two electrical conductors of the frequency converter. Advantageously, relatively low current magnitudes can be accurately measured even at high voltages. A common mode current measurement is here means a differential current measurement. The measurement of a large leakage current of partly below 15 mA is therefore also possible with a maximum amplitude of the voltage of up to several hundred volts. According to an advantageous feature of the present invention, the inventive frequency converter may also include an evaluation unit configured to implement the method according to the present invention.

According to an advantageous feature of the present invention, a simple and robust measuring device may be constructed using a soft-magnetic ring core, which also allows the measuring device to be easily galvanically isolated from the rest of the frequency converter. In a three-phase system with a ring core, the three voltage-conducting cables (likewise in a two phase system the two voltage-conducting cables) are routed here through a shared ring core. An additional winding may be attached to the ring core, on which a voltage proportional to the current magnitude of the differential current of the cables can be measured. Alternatively, a compensation converter can be used for measurement purposes in a known manner.

According to another advantageous feature of the present invention, at least one spectral band may be predetermined as a signal portion. In other words, specific frequencies may subsequently be examined in a spectrum of the course to determine whether they satisfy a corresponding predetermined criterion. In the case of a line-commutated rectifier, for example ground faults may be identified in the intermediate circuit by a common mode current detected in the rectifier having a signal portion between 130 Hz and 200 Hz, in particular a 150 Hz signal portion or 180 Hz signal portion. Ground faults in the intermediate circuit may be very clearly distinguished from an operational leakage current on account of an enhanced 150 Hz portion (in the 50 Hz alternating current network, 180 Hz in the 60 Hz network) by mean of a frequency range analysis, said leakage current possibly having 4 kHz portions for instance. The term ground fault in the context of the invention is understood to refer to electrical coupling (galvanic) between the arrangement which includes, on the one hand, the frequency converter and an electrical device operating with the same and, on the other hand, the surroundings, by way of which a current can flow out of the arrangement into the surroundings, independent of the switching processes in the frequency converter; the current magnitude may pose a risk to a person or may cause a fire.

According to an advantageous feature of the present invention, in order to enable such a measurement of a ground fault, the rectifier may include a current converter, which is coupled to an electrical wiring system for the mains voltage, which is arranged between a mains voltage input of the rectifier and the semiconductor power switch of the rectifier. In other words, the common mode current may be measured on the mains side upstream of the power switches of the rectifier. This provides fault protection against ground faults in the DC voltage intermediate circuit of the frequency converter.

According to another advantageous feature of the present invention, the inverter of the frequency converter may include a measuring device, wherein a common mode current is coupled here in an AC voltage electrical wiring system for the AC voltages (on the output side) by means of a current converter of the measuring device. In other words, a common mode current measurement is performed here on the AC voltage side of the power switch of the inverter. This may then protect against ground faults on motor cables or in an electrical machine operated by the inverter. Moreover, fault currents within the machine can be identified.

According to another advantageous feature of the present invention, at least one time segment to be predetermined in the determined course of the current magnitude may be checked as a signal portion. The course of the operational leakage current can advantageously be determined at any time for instance from the control signals for the inverter. A measured common mode current can be accepted as operationally plausible for the duration of the change in voltage in the AC voltage electrical wiring system (caused by the switching processes of the inverter) and thereby preventing a faulty activation. If, on the other hand, the change in voltage including a time reserve elapses and a common mode current is still measured, a fault is assumed and a protective device is activated. In other words, signal changes during the switching phases of the power switches, inclusive of a time reserve, are filtered out, since a leakage current is to be expected here. In the event that an active power rectification is performed by the rectifier of the frequency converter, when the rectifier is being operated as a boost converter for instance, a fault current detection is also possible in the rectifier by predetermining at least one time segment as a signal portion to be analyzed.

According to another advantageous feature of the present invention, the course may be divided into time segments, during which the criterion is to be checked, and time segments, during which a leakage current is to be expected and therefore the fault check is omitted, by monitoring a switching signal for the semiconductor power switches of the frequency converter and, depending on the checked switching signal, examining a time segment of the determined course of the current magnitude in relation to the criterion. A separate measurement for determining the suitable time segments is then advantageously no longer required, since all information is already contained in the switching signal.

According to an advantageous feature of the present invention, the inventive frequency converter includes an evaluation device which is coupled, on one hand, to a measuring device for measuring the course of the current magnitude and, on the other hand, to a control device for controlling semiconductor power switches of the inverter and/or rectifier. All information for a precise analysis of the current magnitude course is then available in this evaluation device.

According to another advantageous feature of the present invention, the switching times of semiconductor power switches may be identified by providing the inverter with a voltage measuring device which is capacitively coupled to the electrical wiring system for the AC voltages and measures a course of the AC voltages generated by the inverter. This embodiment advantageously does not require a connection to the control device for the semiconductor power switches.

According to an advantageous feature of the present invention, pulses of an AC converter, via which the current is conducted, may be suppressed for interrupting the current in the event that a fault current is detected. The term pulse here relates to the switching signals for the semiconductor power switches of the inverter. With this embodiment, no additional switches have to be provided in order to block the fault current. Because only the pulses of the inverter via which the fault current flows are suppressed, the rectifier and the intermediate circuit remain useable for operating additional inverters.

According to another advantageous feature of the present invention, the entire frequency converter may be decoupled from the supply network which forms the source of the current conducted over the frequency converter for interrupting the current. This has the advantage of enabling an already standardized switching device (such as for instance a contactor) or a switching device of a power switch arranged upstream of the rectifier on the mains side to be used to decouple the frequency converter.

When a ground fault interrupter is also to be arranged upstream of the rectifier on the mains side, this ground fault interrupter may advantageously have a low frequency activation spectrum through bandwidth limitation and the current through this ground fault interrupter may be interrupted here only at fault currents with an alternating frequency of less than 150 Hz, in particular less than 100 Hz. With the inventive frequency converter, a standard ground fault interrupter may thus advantageously be arranged upstream of the rectifier on the mains side, which due to the bandwidth limitation is not unintentionally activated by a leakage current, as may occur by the switching processes within the frequency converter.

A ground fault interrupter arranged upstream of the rectifier on the mains side having a bandwidth limitation may advantageously be employed in conjunction with a low leakage current filter arranged upstream of the rectifier on the mains side as an EMC filter for the frequency converter. Such a filter produces an operational leakage current during normal operation of the frequency converter, which is smaller than a magnitude of an activation current of the upstream ground fault interrupter. This advantageously eliminates a further source for faulty activations of the ground fault interrupter arranged upstream of the rectifier on the mains side.

The developments described in conjunction with the inventive method include corresponding developments of the inventive frequency converter similar to the invention, without being described again here in detail. The same also applies accordingly to the described developments of the inventive frequency converter, which also include corresponding developments of the inventive method similar to the invention, without being described again here in detail.

BRIEF DESCRIPTION OF THE DRAWING

Other features and advantages of the present invention will be more readily apparent upon reading the following description of currently preferred exemplified embodiments of the invention with reference to the accompanying drawing, in which:

FIG. 4 shows a diagram with a temporal course of a common mode current, as in a ground fault interrupter arranged upstream of the rectifier in FIG. 1 on the mains side.

DETAILED DESCRIPTION OF PREFERRED EMBODIMENTS

Figure 1:
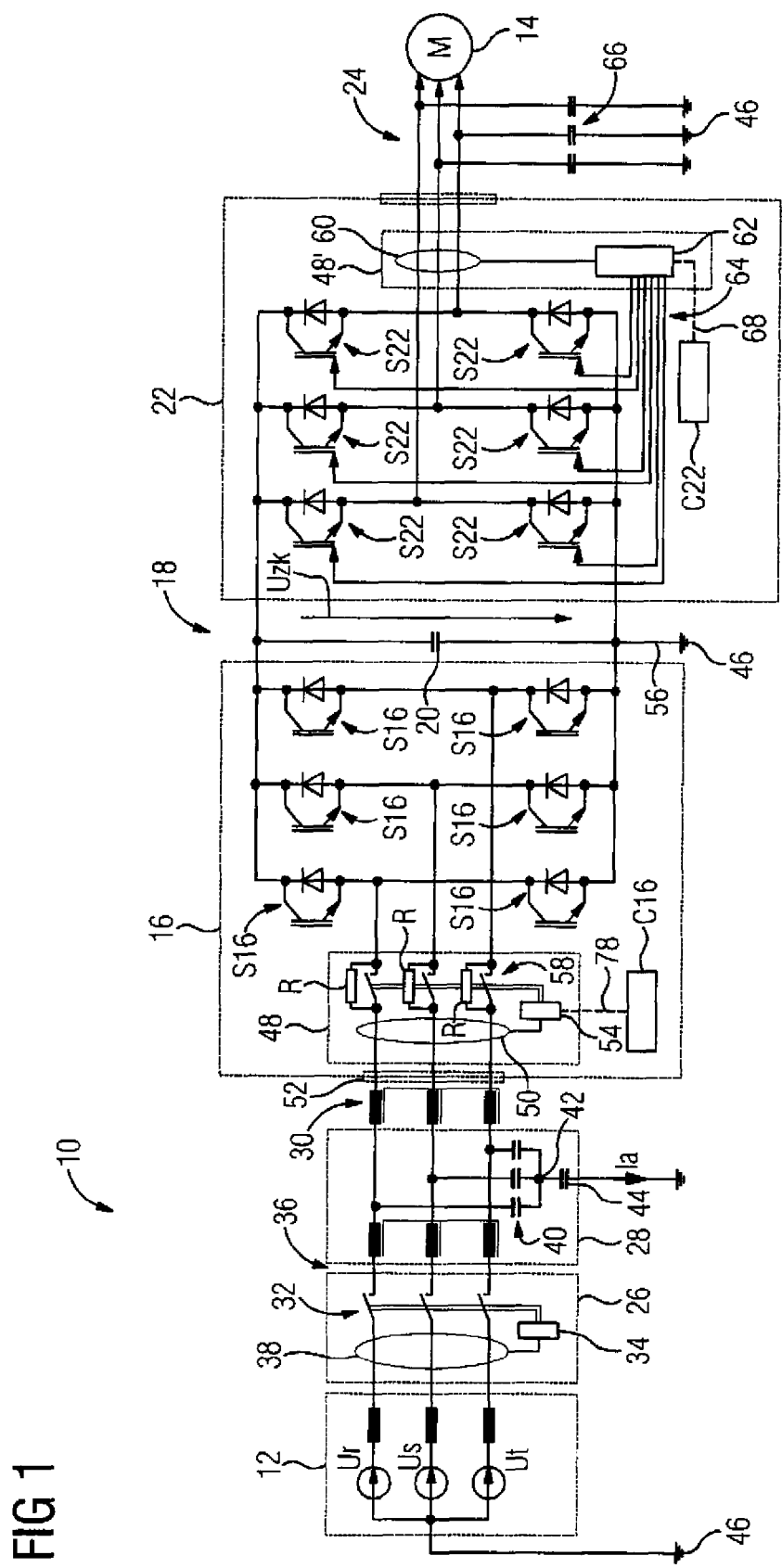
FIG. 1 shows a block diagram of a frequency converter according to the present invention.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a frequency converter 10 which is connected to an electrical alternating current power supply 12. Mains voltages or star voltages Ur, Us, Ut of the power supply 12 have an effective value of 230 V and alternating frequency of 50 Hz in the example. An electrical machine 14 is operated as an electric motor in the mains power supply 12 by way of the frequency converter 10.

For operation of the electric machine 14, a rectifier 16 of the frequency converter 10 generates a rectified intermediate circuit voltage UzK, which is smoothed by a smoothing capacitor 20, from the star voltages Ur, Us, Ut in an intermediate circuit 18. An inverter 22 generates phase-shifted AC voltages with an alternating frequency and an effective value from the intermediate circuit voltage UzK, both of which are set by means of the inverter 22. The motor cables 24 represent an electrical wiring system for the AC voltages generated by the inverter 22.

Aside from the inverter 22, the frequency converter 10 can include still further (not shown) inverters, by way of which further electric machines can correspondingly be operated in the intermediate circuit 18.

In order to generate the intermediate circuit voltage Uzk from the star voltages Ur, Us, Ut the rectifier 16 includes semiconductor power switches S16, each of which includes here a parallel circuit including an IGBT (insulated-gate bipolar transistor) and a diode. Control cables for the IGBTs, by way of which switching pulses of a control unit C16 of the rectifier 16 are transmitted, are not shown in FIG. 1.

The AC converter 22 similarly has semiconductor power switch S22, by means of which a control unit C22 of the inverter 22 generates the AC voltages in the motor cables from the intermediate circuit dc voltage Uzk. The semiconductor power switch S22 has the same structure as the semiconductor power switch S16. Control cables, by way of which the control unit C22 controls IGBTs of the semiconductor power switch S22, are likewise not shown in FIG. 1.

A fault current switch 26, an EMC filter 28 and commutating throttles 30 are arranged upstream of the rectifier 16 on the mains side, in other words toward the mains power supply 12.

A current flowing into the frequency converter 10 from the mains power supply 12 can be interrupted by a contactor 32 with the ground fault interrupter 26. The contactor 32 is always interrupted by an evaluation unit 24 of the ground fault interrupter 26 whenever a current magnitude of a common mode current, which is determined as a differential current between the network phase conductors 36 of the mains power supply 2, exceeds a predetermined limit value. In order to measure the common mode current, the ground fault interrupter 26 has a ring core 38 with a coil. The ground fault interrupter 26 is of type A, i.e. the differential current signal detected by means of the coil of the ring core 38 is filtered by a low pass so that only signal portions of the differential current signal are evaluated by the evaluation unit 34 up to a frequency of 100 Hz.

The EMC filter 28 includes a star circuit 40 including filter capacitors, the star point 42 of which is capacitively coupled to an earth position 46 by way of a ground capacitor. A leakage current la flowing via the ground capacitor 44 to the ground potential 46 includes a low current magnitude of this type, such that the ground fault interrupter 26 does not trip. To this end, such capacitors are selected as filter capacitors of the star circuit 40, which include as similar a capacitance as possible. In addition, the capacitance of the ground capacitor 44 was selected to be as small as possible.

The frequency converter 10 has two further ground fault interrupters. A ground fault interrupter 48 is integrated in the rectifier 16, a ground fault interrupter 48' is integrated in the inverter 22.

The ground fault interrupter 38 has a ring core 50, which surrounds the network phase conductor 36. The ring core 50 is connected between an AC voltage input 52 of the rectifier 16 and the power switch S16. A signal of a coil of the ring core 50 is monitored by an evaluation unit 54 of the ground fault interrupter 48. With the aid of the signal, the evaluation unit 54 identifies whether a ground fault 56 exists in the intermediate circuit 48. The evaluation unit 54 implements an embodiment of the inventive method. A ground fault on the intermediate circuit is to be distinguished very clearly from an operational leakage current on account of its enhanced 150 Hz signal portion through a frequency range analysis of the signal of the coil of the ring core 50, as can be caused for instance by a capacitive coupling of the intermediate circuit 18 with the earth potential 46, while the semiconductor power switch S16 or A22 are connected. A common mode current measurement, such as is enabled by the ring core 50, can also take place in the intermediate circuit 18 itself.

Upon recognition of a ground fault, the evaluation unit 54 opens a contactor 58 of the ground fault interrupter 48. When the contactor 58 is open, the smoothing capacitor 20 can be charged by way of precharging resistors R of the ground fault interrupter 48. Alternatively to the precharging resistors R, an additional longitudinal contactor may be provided in each instance.

The ground fault interrupter 48' of the inverter 22 has a ring core 60, which surrounds the motor cables 24. A signal of a coil of the ring core 60 is processed by an evaluation unit 62 of the ground fault interrupter 48'. The evaluation unit 62 implements an embodiment of the inventive method. The common mode current measurement implemented by the ring core 60 behind the power switches S22 of the inverter 22 is used to protect against fault currents and ground faults on the motor lines 24 and in the electric machine 14. Upon recognition of an error by way of corresponding signal cables 64, the evaluation unit 62 blocks the control pulses for the power switch S22 emitted to the power switch S22 from the control unit C22. Alternatively, decoupling of the entire frequency converter 10 from the mains power supply 12 can be achieved by way of a power switch on the mains side, such as for instance the contactor 32.

In order to be able to distinguish a fault current from an operational leakage current in the signal of the coil of the ring core 60, such as can be produced for instance by a capacitive coupling 66 of the motor cables 24 to the ground potential, the evaluation unit 62 evaluates the time course of the AC voltages of the motor cables 24. Provision can be made here for the evaluation unit 62 to be coupled to the control unit C22 by way of a signal cable 68, by way of which signal cable the evaluation unit 62 receives the activation signal for the interrupter S22 of the control unit C22. A common mode current measured by means of the ring core 60 is evaluated by the evaluation unit 62 as an operational leakage current for the duration of the change in voltage, such as are caused by switching the power switch S22 in the motor cables 24, including a time reserve. Between these switching edges, the evaluation unit 62 checks the criterion to determine whether a common mode current also exists. If this is the case, a fault is assumed in the motor cables 24 or in the electric machine 14.

Overall, with a frequency converter, a reliable distinction is enabled between an operational leakage current on the one hand and unwanted fault currents on the other hand both by a frequency selective evaluation of the signal of the coils of the ring cores 38 and 50 and also by a time-selective evaluation of the signal of the coil of the ring core 60. A corresponding plausibility check for the signals is always possible by suitable criteria for the evaluation of the signals of the ring cores being determined for measurements at different sites of the frequency converter 10. Which criteria are suitable in such cases can be easily determined by simulations or measuring trials.

With the aid of FIG. 2 to FIG. 4, it is illustrated once again below which signals are produced in the coils of the ring cores 38, 50, 60 for different ground faults over time t (in milliseconds). The measured common mode current is specified in amperes as the Y-axis of the diagram in each instance.

Figure 2:
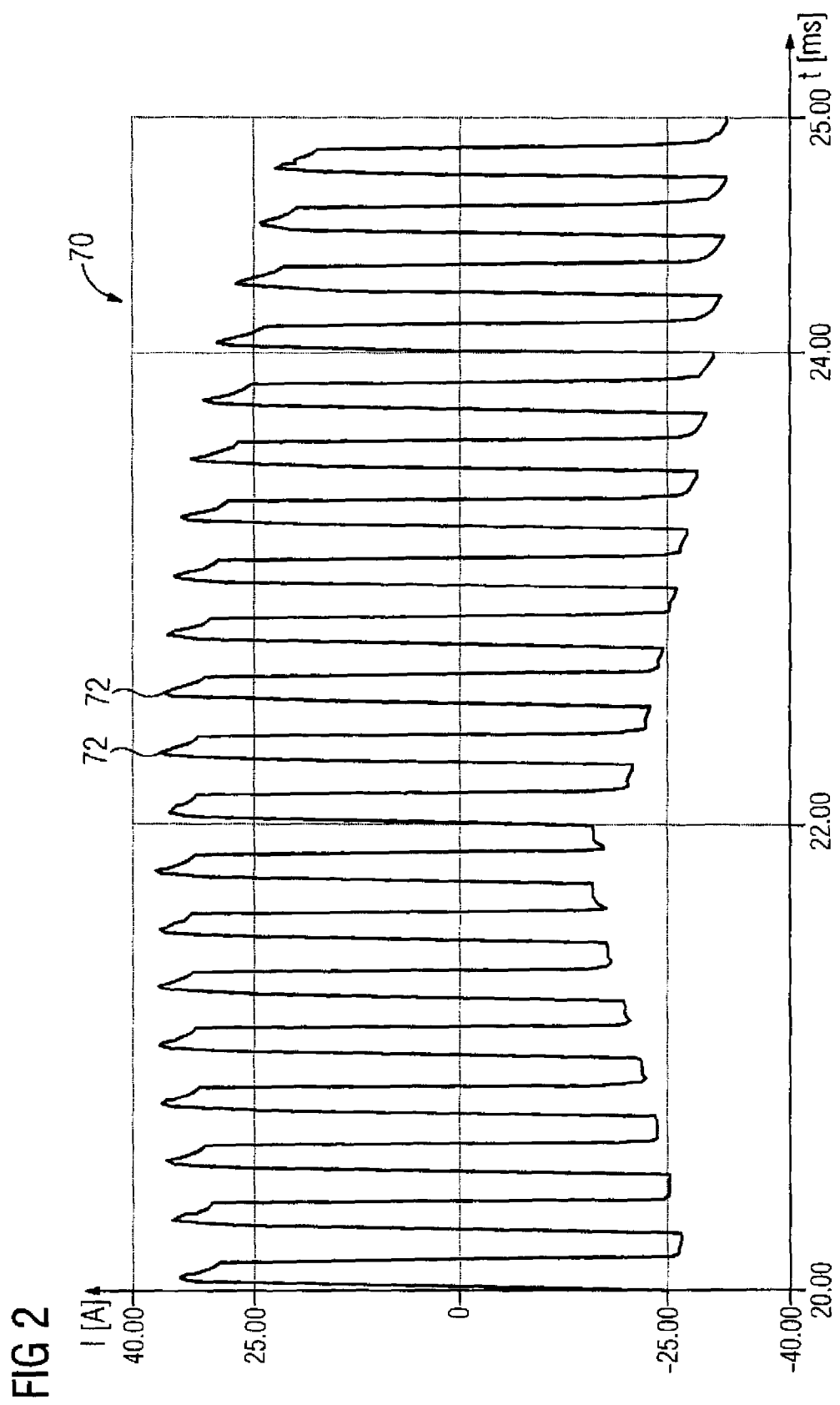
FIG. 2 shows a diagram with a temporal course of a common mode current, as measured in an inverter of the frequency converter of FIG. 1.

FIG. 2 shows a course 70 of a signal of the coil of the ring core 60 in the event of a ground fault on one of the motor cables 24 or in the electrical machine 14. The course includes individual switching peaks 72, of which only two are provided with a reference character in FIG. 2 for the sake of clarity. The individual switching peaks 72 are generated by reloading processes on the motor cables 24, which cause a leakage current through the capacitive coupling 66. For the duration of a switching peak 72, a value of the course 70 is not checked by the evaluation unit 62 to determine whether its amount lies above a predetermined threshold value. Between the individual switching peaks 72 the course 70 has an amount which does not result from the switching processes of the power switch S22, but instead from the ground fault. Overall, a block-shaped course 70 is produced, in other words a sequence of almost rectangular pulses. Without the ground fault, the course 70 would include exclusively (almost Dirac-type) switching peaks. On account of the ground fault, the amount of the course is therefore greater immediately after the appearance of each switching peak 72. This is identified by the evaluation unit 62 on the basis of a threshold value used as checking criterion, said threshold value exceeding the amount of the course 70 after each switching peak 72. It subsequently switches the power switch S22 into a blocking state, by suppressing the switching pulses of the control unit C22.

Figure 3:
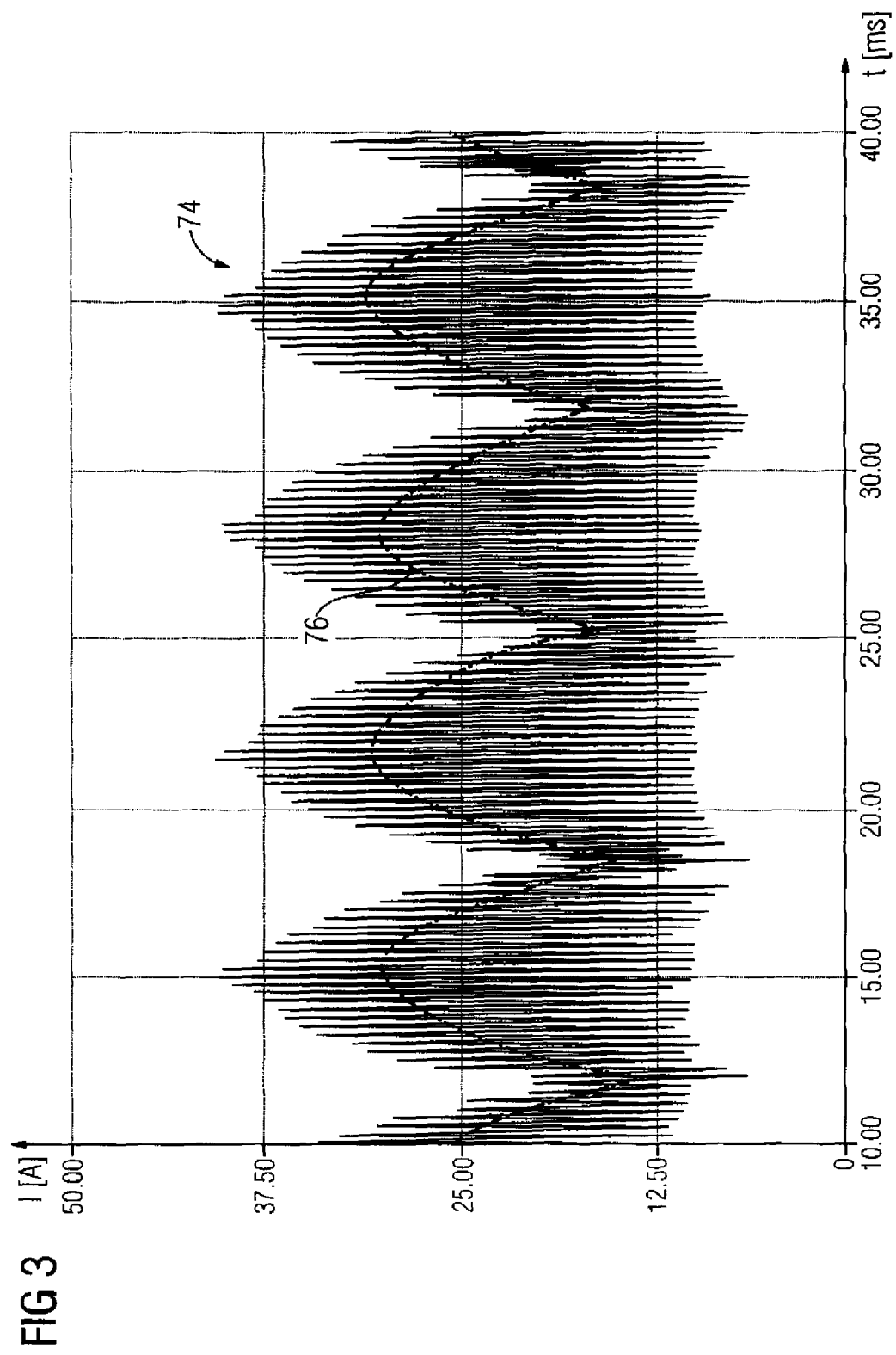
FIG. 3 shows a diagram with a temporal course of a common mode current, as measured in a rectifier of the frequency converter of FIG. 1.

FIG. 3 shows a course 74 of a signal of the coil of the ring core 50, as is produced in a ground fault in the intermediate circuit 18. Aside from individual switching peaks which are caused by switching processes in the rectifier 16, the course 64 has a 150 Hz signal portion 76 identified by the evaluation unit 54 with the aid of a bandpass filter. This portion is caused by the ground fault. The evaluation unit 54 subsequently generates a signal, by means of which the contact 58 is opened. In the evaluation unit 54, the evaluation of the course 74 can also be restricted to temporal segments, which lie between the individual switching peaks. To this end, the evaluation unit 54 can be connected to the control unit C16 by way of a signal line 78.

FIG. 4 shows a course 78 of the signal of the coil of the ring cover 38, as is produced in a ground fault of the mains phase conductor 36. Individual switching peaks of the course 78, which are caused by switching processes of the power switch S16 of the rectifier 16, are filtered out by the low-pass filter of the ground fault interrupter 26. The evaluation unit 34 identifies the ground fault on a 50 Hz signal portion 80 remaining after the filtering. It subsequently opens the contactor 32.

The example shows how protection from ground faults can be provided on motor cables and in motors and in the process how a monitoring function integrated in the motor module (inverter 22) can be used to filter out the operational leakage current as occurs on account of the switching edges of the AC converter 22. A common mode current measurement in the supply unit (rectifier 16) provides for a protection against ground faults on the intermediate circuit and in the motor cables. In this way, the fault protection concentrates on signal portions, which arise due to the rectification of the mains voltages, i.e. the fault protection searches for instance intentionally for leakage current portions with a spectral signal portion of 150 Hz and/or switching edges which occur due to an active mains rectification. This protection concept is completed by a ground fault interrupter on the mains side of type A. This is intentionally selected such that compared with operational leakage currents and fault currents in the pulse frequency range, it is "blind". This is effected here by a low-pass. The necessary protection function for pulse frequency portions is already integrated here into the AC converters.

By means of this measure, a ground fault interrupter with band limitation (low pass filter) can be used on the mains side. This is no longer activated by an operational leakage current of the frequency converter, since interferences, as are caused by switching the power switches S16, S22, lie in the frequency above the band limitation. Only a leakage current thus remains, which can arise due to unbalances in the mains voltage and in filter capacitors of an EMC filter. It is possible here to use a filter with low leakage current with a low earth capacitance, the leakage current of which, with the same imbalance of the mains voltages, is lower than that of a conventional EMC filter. Since a large earth capacitance no longer has to be used here in order to close the operational leakage current with a high frequency in the frequency converter, the use of low leakage current filters is possible without any problem.

The use of a band-limited ground fault interrupter is enabled by relocating some monitoring functions from the ground fault interrupter on the mains side into the rectifier and/or the inverter. These have information relating to the times of the switching edges and the voltage waveform of the intermediate circuit voltage, with the aid of which a distinction can easily be made between possible faults and operational leakage currents.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

1. A method for at least one of identifying and blocking a fault current in a frequency converter, comprising the steps of:
    determining a course of a magnitude of a current flowing through the frequency converter;
    monitoring a switching signal for semiconductor power switches of the frequency converter,
    disregarding in the so determined current flow substantially Dirac-shaped switching peaks characteristic of a fault-free operation of the frequency converter to predefine for the determined course a signal portion which is independent of switching processes within the frequency converter while the frequency converter operates fault-free,
    checking whether the predefined signal portion comprises substantially rectangular pulses following the substantially Dirac-shaped switching peaks, and interrupting the current if the course of a magnitude of the substantially rectangular pulses is greater than a predetermined threshold value.

2. The method of claim 1, further comprising the step of determining a course of a magnitude of a differential current between at least two phase conductors of the frequency converter.

3. The method of claim 1, wherein the predefined signal portion comprises at least one spectral band.

4. The method of claim 3, wherein a fault current in an intermediate circuit of the frequency converter is indicated by a common mode current of the predefined signal portion having an enhanced signal portion in a frequency range of less or equal to three times a frequency of a supply network, thereby.

5. The method of claim 1, wherein the predefined signal portion comprises at least one time segment.

6. The method of claim 1, further comprising the step of suppressing pulses of an inverter, through which a fault current flows, so as to interrupt the current flowing through the frequency converter.

7. The method of claim 6, wherein the current is interrupted by decoupling the frequency converter from a supply network forming a source of the current.

* * * * *